(12) United States Patent
Hsu

(10) Patent No.: US 9,825,147 B2
(45) Date of Patent: Nov. 21, 2017

(54) METHOD OF FORMING HIGH VOLTAGE METAL-OXIDE-SEMICONDUCTOR TRANSISTOR DEVICE

(71) Applicant: UNITED MICROELECTRONICS CORP., Hsin-Chu (TW)

(72) Inventor: Ming-Shun Hsu, Miaoli County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/231,792

(22) Filed: Aug. 9, 2016

(65) Prior Publication Data

US 2016/0351690 A1 Dec. 1, 2016

Related U.S. Application Data

(62) Division of application No. 14/506,700, filed on Oct. 6, 2014, now Pat. No. 9,443,958.

(51) Int. Cl.
*H01L 29/66* (2006.01)
*H01L 29/78* (2006.01)
*H01L 29/423* (2006.01)
*H01L 29/10* (2006.01)

(52) U.S. Cl.
CPC .... *H01L 29/66689* (2013.01); *H01L 29/1037* (2013.01); *H01L 29/4236* (2013.01); *H01L 29/42368* (2013.01); *H01L 29/42372* (2013.01); *H01L 29/66704* (2013.01); *H01L 29/7816* (2013.01); *H01L 29/7825* (2013.01); *H01L 29/7835* (2013.01)

(58) Field of Classification Search
CPC .......... H01L 29/66681; H01L 29/7816; H01L 29/7835; H01L 29/66689; H01L 29/42372; H01L 29/66704; H01L 29/1037; H01L 29/43268; H01L 29/43272
See application file for complete search history.

(56) References Cited

U.S. PATENT DOCUMENTS

| 5,597,765 | A | 1/1997 | Yilmaz | |
|---|---|---|---|---|
| 6,940,145 | B2 * | 9/2005 | Blair | H01L 21/76229 257/446 |
| 8,168,496 | B2 | 5/2012 | Hebert | |
| 2005/0202637 | A1 | 9/2005 | Chiola | |
| 2006/0071270 | A1 * | 4/2006 | Shibib | H01L 21/223 257/341 |
| 2007/0023827 | A1 * | 2/2007 | Tu | H01L 29/0634 257/330 |

(Continued)

*Primary Examiner* — Nathan W Ha
(74) *Attorney, Agent, or Firm* — Winston Hsu

(57) ABSTRACT

A method of forming a HVMOS transistor device is provided. A substrate is provided. A first insulation structure and a trench are formed in the substrate. A base region having a second conductivity type is formed, wherein the base region completely encompasses the trench. Next, a gate dielectric layer and a gate structure are formed in the trench and covering a portion of the first insulation structure. Then, a drain region and a source region are formed in the substrate at two respective sides of the gate structure, and the drain region and the source region comprise a first conductivity type complementary to the second conductivity type. A channel is defined between the source region and the drain region along a first direction.

8 Claims, 5 Drawing Sheets

(56) References Cited

U.S. PATENT DOCUMENTS

| | | | |
|---|---|---|---|
| 2007/0138566 A1* | 6/2007 | Suzuki | H01L 21/823412 |
| | | | 257/369 |
| 2009/0256212 A1* | 10/2009 | Denison | H01L 29/0653 |
| | | | 257/408 |
| 2009/0273029 A1 | 11/2009 | Tien | |
| 2009/0283825 A1 | 11/2009 | Wang | |
| 2010/0001343 A1 | 1/2010 | Choi | |
| 2010/0102386 A1 | 4/2010 | You | |
| 2010/0148251 A1* | 6/2010 | Lim | H01L 29/0657 |
| | | | 257/335 |
| 2010/0301413 A1 | 12/2010 | You | |
| 2014/0042527 A1* | 2/2014 | Lee | H01L 29/4236 |
| | | | 257/330 |

* cited by examiner

METHOD OF FORMING HIGH VOLTAGE METAL-OXIDE-SEMICONDUCTOR TRANSISTOR DEVICE

CROSS REFERENCE TO RELATED APPLICATIONS

This application is a Divisional of application Ser. No. 14/506,700 filed on Oct. 6, 2014, and included herein by reference.

BACKGROUND OF THE INVENTION

1. Field of the Invention

The invention relates to a method of forming a high voltage metal-oxide-semiconductor (herein after abbreviated as HVMOS) transistor device, and more particularly, to a method of forming a high voltage lateral double-diffused metal-oxide-semiconductor (HV-LDMOS) transistor device.

2. Description of the Prior Art

Double-diffused MOS (DMOS) transistor devices have drawn much attention in power devices having high voltage capability. The conventional DMOS transistor devices are categorized into vertical double-diffused MOS (VDMOS) transistor device and lateral double-diffused MOS (LDMOS) transistor device. Having advantage of higher operational bandwidth, higher operational efficiency, and convenience to be integrated with other integrated circuit due to its planar structure, LDMOS transistor devices are prevalently used in high operational voltage environment such as CPU power supply, power management system, AC/DC converter, and high-power or high frequency (HF) band power amplifier. The essential feature of LDMOS transistor device is a lateral-diffused drift region with low dope concentration and large area. The drift region is used to alleviate the high voltage between the drain and the source, therefore the LDMOS transistor device can have higher breakdown voltage.

It is well-known that characteristics of low $R_{ON}$ and high breakdown voltage are always required to the HVMOS transistor device. However, breakdown voltage and $R_{ON}$ are conflicting parameters with a trade-off relationship. Therefore, a HV-LDMOS transistor device that is able to realize high breakdown voltage and low $R_{ON}$ is still in need.

SUMMARY OF THE INVENTION

It is therefore one objectives of the present invention to provide an HVMOS, especially an HV-LDMOS with superior electrical performance and a method of forming the same.

According to one embodiment, an HVMOS transistor device is provided. The HVMOS has a substrate, a gate structure, a drain region and a source region, a base region and a gate dielectric layer. The substrate has a first insulating structure disposed therein. The gate structure is disposed on the substrate and comprises a first portion covering a portion of the first insulating structure. The drain region and the source region are disposed in the substrate at two respective sides of the gate, and comprise a first conductivity type. The base region encompasses the source region, wherein the base region comprises a second conductivity type complementary to the first conductivity type. The gate dielectric layer is between the gate and the drain region, the base region and the substrate. The gate structure further comprises a second portion penetrating into the base region in the substrate.

According to another embodiment, a method of forming a HVMOS transistor device is provided. A substrate is provided. A first insulation structure and a trench are formed in the substrate. A base region having a second conductivity type is formed, wherein the base region completely encompasses the trench. Next, a gate dielectric layer and a gate structure are formed in the trench and covering a portion of the first insulation structure. Then, a drain region and a source region are formed in the substrate at two respective sides of the gate structure, and the drain region and the source region comprise a first conductivity type complementary to the second conductivity type. A channel is defined between the source region and the drain region along a first direction.

Since the gate structure has a second portion penetrating into the substrate in the base region, the breakdown voltage of the HVMOS transistor device can be increased. In addition, the controllability of the gate structure can be improved.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be made in detail. The preferred embodiments of the present invention are illustrated in the accompanying drawings with numbered elements.

Figure 1:
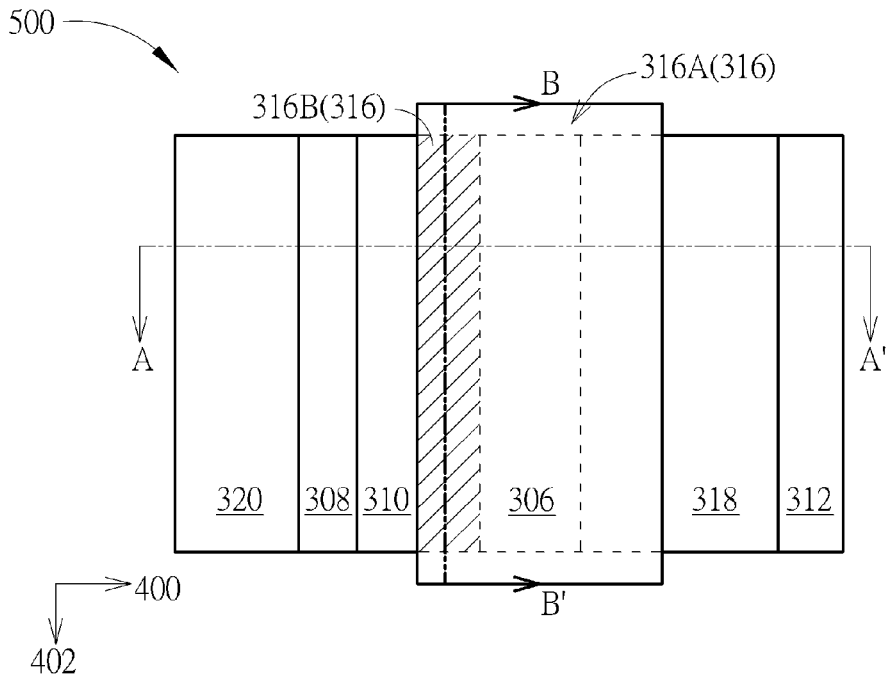
FIG. 1 to FIG. 3 show schematic diagrams of the HVMOS according to the first embodiment of the present invention.
Figure 2:
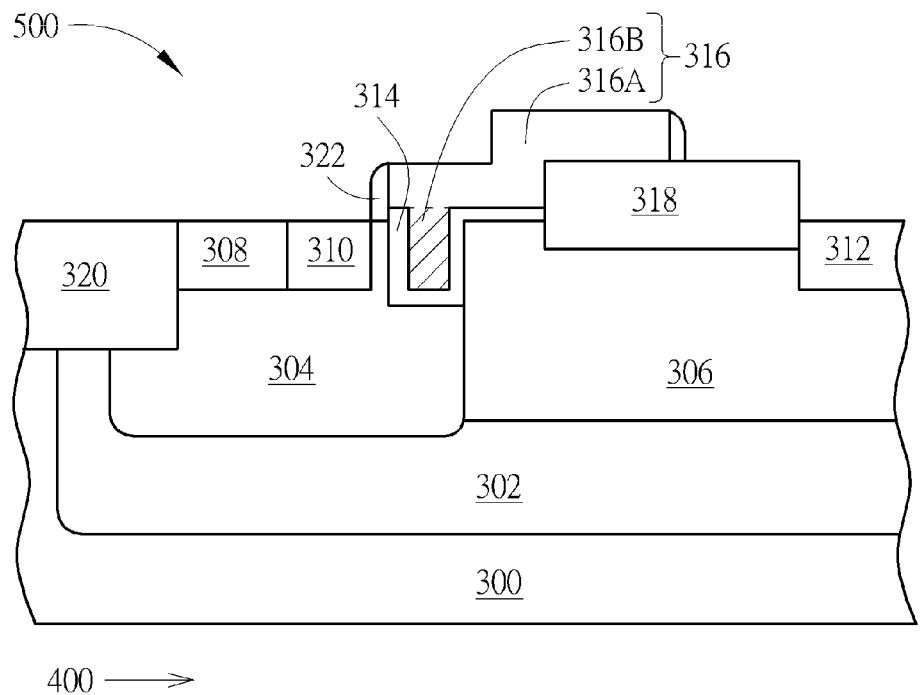
Figure 3:
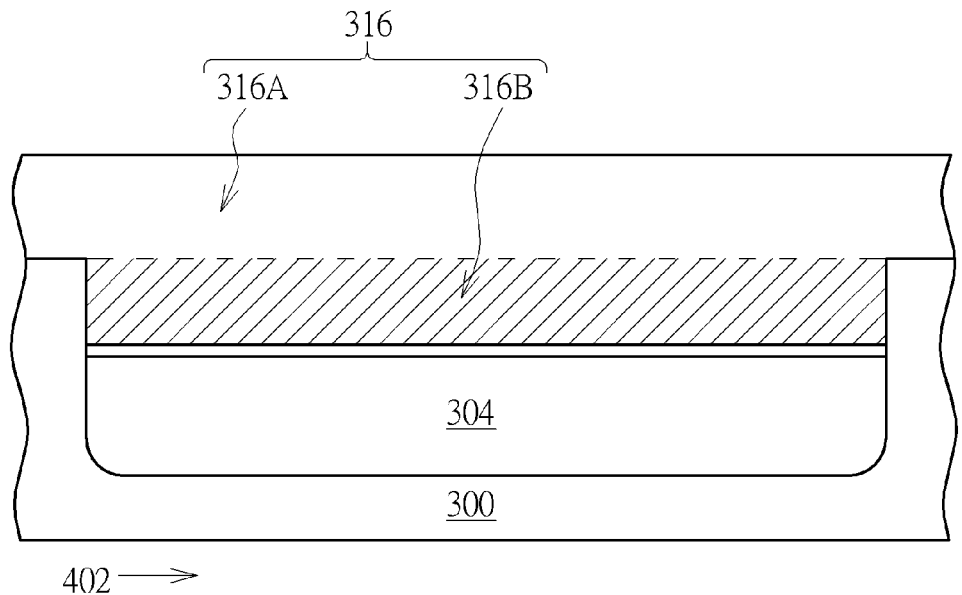

Please refer to FIG. 1 and FIG. 3, which shows schematic diagrams of the HVMOS transistor device according to the first embodiment of the present invention. FIG. 1 is a top view of an HVMOS transistor device, FIG. 2 is a cross-sectional view of the HVMOS transistor device taken along line AA' of FIG. 1 (along a first direction 400), and FIG. 3 is a cross-sectional view of the HVMOS transistor device taken along line BB' of FIG. 1 (along a second direction 402, which is substantially perpendicular to the first direction 400). As shown in FIG. 1 and FIG. 2, the HVMOS transistor device 500 includes a substrate 300, a deep well 302, a base region 304, a drift region 306, a doping region 308, a source region 310, a drain region 312, a gate dielectric layer 314, a gate structure 316, a spacer 322, a first insulation structure 318 and a second insulation structure 320. The substrate 300 can be a silicon substrate, an epitaxial silicon substrate, a silicon germanium substrate, a silicon carbide substrate or a silicon-on-insulator (SOI) substrate. The first insulation structure 318 is disposed on the substrate 300 and a portion thereof penetrates into the drift region 306 in the substrate 300. In one embodiment, the first insulation structure 318 may be a shallow trench isolation (STI) or a field oxide (FOX), and preferably, it is a FOX. The gate structure 316 in the present invention includes a first portion 316A above the substrate 300 and covers a portion of the first insulation structure 318, and a second portion 316B penetrating into the substrate 300. The gate dielectric layer 314 is disposed between the gate structure 316 and the source region 310, the base region 304 and the drift region 306. The detail descriptions of the gate structure 316 and the gate dielectric layer 314 will be shown in the following context. The spacer 322 is disposed at a sidewall of the gate structure 316. The source region 310 and the drain region 312 are disposed in the substrate 300 at two sides of the gate structure 316, wherein the drain region 312 is at the side of the first insulation structure 318 and the source region 310 is at the other side. The doping region 308 is disposed next to the source region 310, and preferably directly contacts the source region 310. The second insulation structure 320 is disposed in the substrate 300 next to the doping region 308, and preferably directly contacts the doping region 308. In one embodiment, the second insulation structure 320 is a shallow trench isolation (STI). The base region 304 is disposed in the substrate 300 under the second portion 316B of the gate structure 316, the source region 312, the doping region 308 and a portion of the second insulation structure 320. Preferably, the base region 304 completely encompasses the second portion 316B of the gate structure 316, the source region 312 and the doping region 308. The drift region 306 is disposed in the substrate 300 and under the first insulation structure 318 and the drain region 312. The deep well 302 is disposed under the base region 304 and the drift region 306 and preferably encompasses them. In some embodiments, the deep well 302, the drift region 306, the doping region 308 and the spacer 322 can be omitted or adjusted if required.

The above-mentioned regions can be divided into two conductivity types, the first conductivity type and the second conductivity type, which are complementary to each other. In one embodiment, the first conductivity type is N type and the second conductivity type is P type and vice versa. In the present invention, the source region 310, the drain region 312, the drift region 306 and the deep well 302 are the first conductivity type. In one embodiment, regarding to concentrations of the dopants, the drain region 312=(about equal) the source region 310> the drift region 306> the deep well 302. The doping region 308 and the base region 304 have the second conductivity type, and dopant concentration of the doping region 308 is greater than that of the base region 304.

As shown in FIG. 2 in conjunction with FIG. 3, it is one salient feature in the present invention that the second portion 316B of the gate structure 316 penetrates downwardly into the substrate 302, and preferably into the base region 304. In this embodiment, the second portion 316B has a continuous contour in the cross-sectional along the second direction 402. Precisely speaking, the second portion 316B of the gate structure 316 that penetrates into the base region 304 has only one predetermined depth, thereby forming a "bulk structure" in the base region 304. In one embodiment, the predetermined depth thereof is equal to that of the source region 310. It is noted that, since the channel of the HVMOS 300 is defined between the source region 310 and the drain region 312 and the current flows across the first direction 400 shown in FIG. 2, the pathway of the current can be enlarged because of the additional distance due to the second portion 316B. As a result, the breakdown voltage of the HVMOS transistor device 500 can be increased, while $R_{on}$ of the HVMOS transistor device 500 can be decreased. Accordingly, the electrical performance of the device is upgraded. In one embodiment, the second portion 316B of the gate structure 316 is directly adjacent to the source region 310 and the gate dielectric layer 314 directly contacts the source region 310. In one embodiment, a depth of the second insulation structure 320 is greater than that of the second portion 316B. In one embodiment, the gate dielectric layer 314 as well as the second portion 316B has a predetermined distance between the boundary between the base region 304 and the drift region 306. In one embodiment, they may have another distance from the source region 310. In another embodiment, the gate dielectric layer 314 has a portion vertically aligned with the boundary between the base region 304 and the drift region 306.

Figure 4:
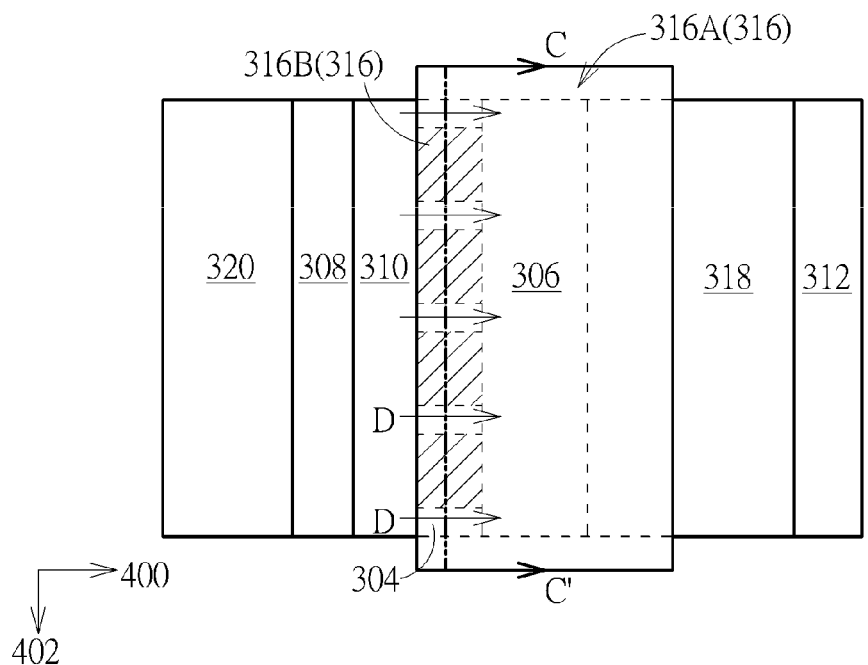
FIG. 4 and FIG. 5 show schematic diagrams of the HVMOS according to the second embodiment of the present invention.
Figure 5:
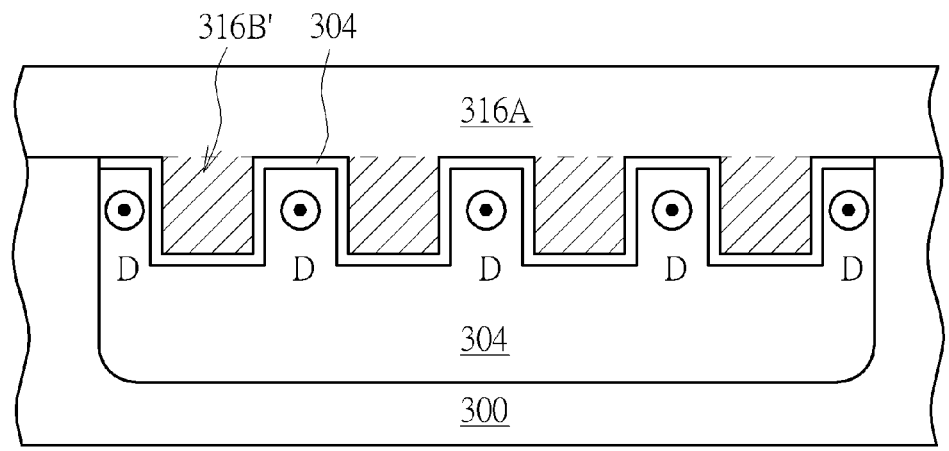
Figure 6:
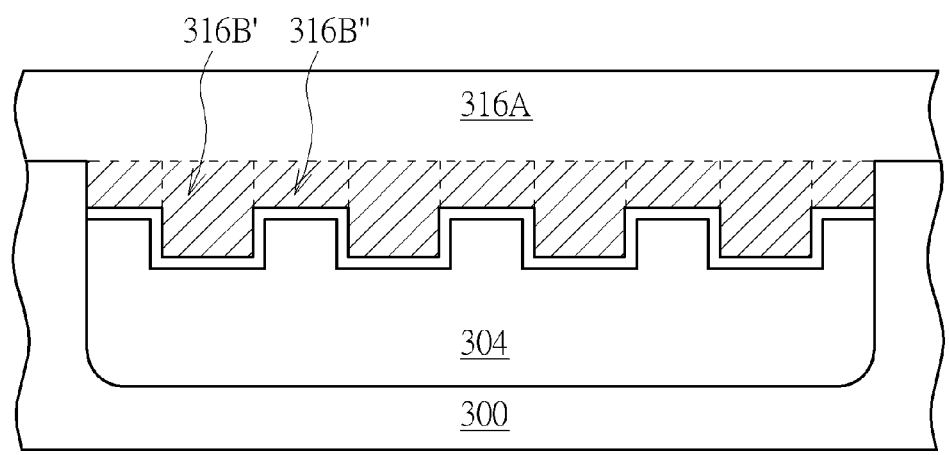
FIG. 6 show schematic diagrams of the HVMOS according to the third embodiment of the present invention.

Please refer to FIG. 4 and FIG. 5, which show schematic diagrams of the HVMOS transistor device according to the second embodiment of the present invention. FIG. 4 is a top view of an HVMOS transistor device provided by the second embodiment of the present invention and FIG. 5 is a cross-sectional view of the HVMOS transistor device taken along line CC' of FIG. 4. As shown in FIG. 4 and FIG. 5, rather than the "bulk structure", the second portion 316B of the gate structure 316 has a "battlement structure", which means that the contour of the gate structure 316 is not continuous along the cross-sectional view. In the present embodiment, the second portion 316B has a plurality of sub-second portions 316B' which are disposed in the base region 304, each of which has the same depth, and these sub-second portions 316B' and the base region 304 are arranged alternatively along the second direction 402. It is understood that since the current preferably flows in a pathway with lower resistance, it preferably flows along a pathway like the arrow D, which is between each two of the sub-second portions 316B', thereby forming a multi-channel structures. In the present embodiment, the gate structure 316 with the sub-second portions 316B' is like a palm with fingers stretching into the substrate 300 for controlling the current flow. Consequently, the HVMOS transistor device 500 can has excellent gate control ability. In another embodiment, please see FIG. 6, which shows a schematic diagram of the HVMOS transistor device according to the third embodiment of the present invention, the second portions 316B has two groups of sub-second potions 316B' and 316B", each set of which is arranged alternatively and has different depths from that of another set. In another embodiment, more than two groups or sets of sub second portions are also feasible.

Figure 7:
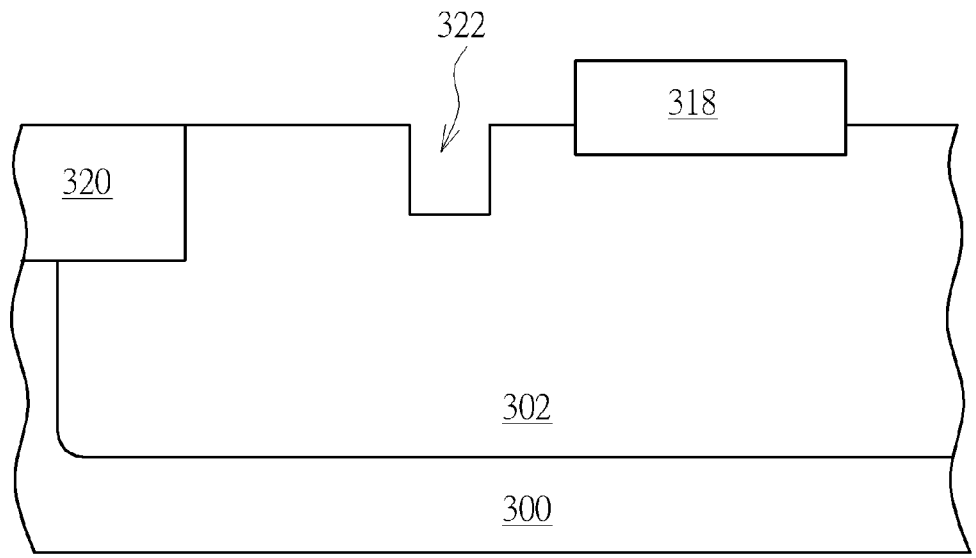
FIG. 7 to FIG. 10 show schematic diagrams of the method of forming an LVMOS transistor device according to one embodiment of the present invention.

Please refer to FIG. 7 to FIG. 10, which show schematic diagrams of the method of forming an HVMOS transistor device according to one embodiment of the present invention. As shown in FIG. 7, a substrate 300 is provided. The substrate 300 can be a silicon substrate, an epitaxial silicon substrate, a silicon germanium substrate, a silicon carbide substrate or a silicon-on-insulator (SOI) substrate. The substrate 300 has a deep well 302 having the first conductivity type. Next, a second insulation structure 320 and a first insulation structure 318 and are formed in the substrate 300, wherein the forming sequence thereof can be adjusted arbitrarily. A trench 322 is formed in the substrate 300 with a predetermined depth. The trench 322 is used to accommodate the second portion 316B of the gate structure 316 in the following steps. The trench 322 may have different shapes based on different embodiments of the second portion 316B. For example, when the second portion 316B has a "bulk structure" in the first embodiment shown in FIG. 3, the trench 322 is a straight trench with only one depth. When the second portion 316B has a "battlement structure" as shown in FIG. 5, the trench 322 has a plurality of sub trenches (not shown in FIG. 7 but can refer to FIG. 5). When forming the second portion 316B in FIG. 6, the trench 322 has more than one set of sub trenches (not shown in FIG. 7 but can refer to FIG. 6), each may has different depths. In one embodiment, a depth of the second insulation structure 320 is greater than that of the trench 322, and the depth of the trench 322 is greater than that of the first insulation structure 318.

Figure 8:
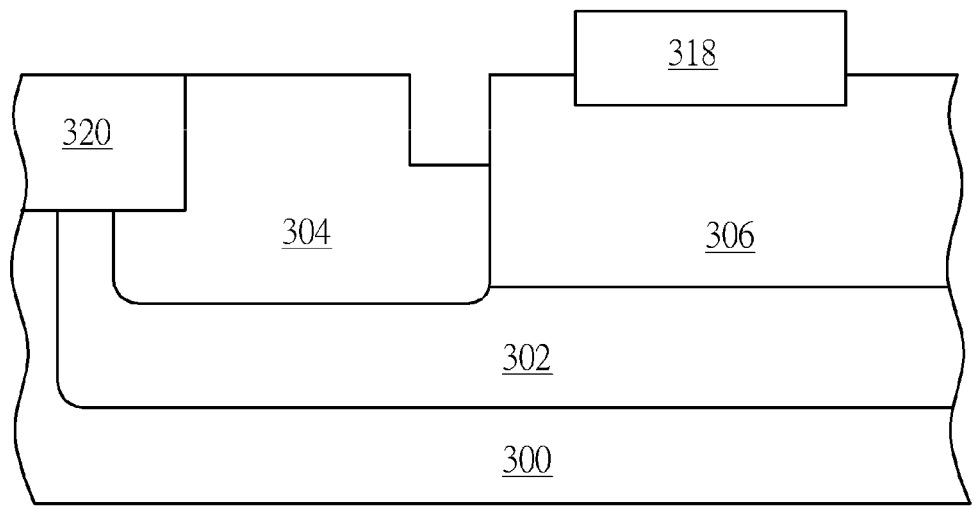
Figure 9:
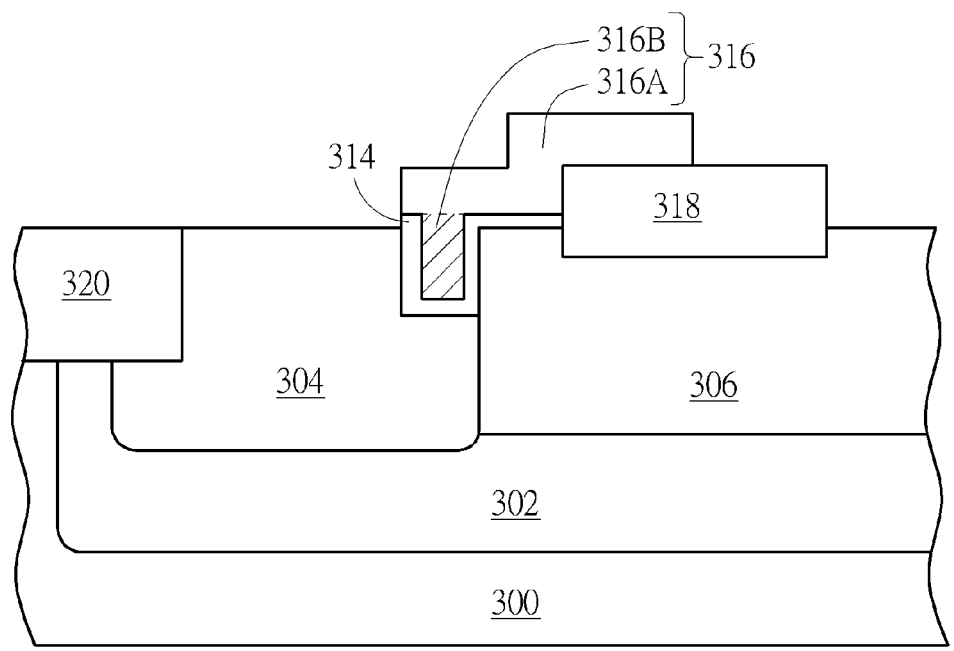

Next, as shown in FIG. 8, a drift region 306 and a base region 304 are formed in the deep well 302, wherein the forming sequence thereof can be adjusted arbitrarily. The drift region 306 has the first conductivity type and the base region 304 has the second conductivity type. The base region 304 encompasses the trench 322 and in one embodiment, a boundary of the base region 304 vertically aligns with a sidewall of the trench 322 while in another embodiment, a predetermined distance thereof can be provided As shown in FIG. 9, a gate dielectric layer 314 and a gate structure 316 are formed on the substrate 300. For example, a deposition process or an oxidation process is performed to form a pre-dielectric layer (not shown) comprehensively on the substrate 300, which at least covers a surface of the trench 322 and the drift region 306. Next, a conductive layer (not shown) made of poly-silicon for example is formed on the pre-dielectric layer to completely fill the trench 322. A photo-etching-process (PEP) is performed to pattern the pre-dielectric layer and the conductive layer such that the pre-dielectric layer becomes the gate dielectric layer 314 and the conductive layer becomes the gate structure 316. As shown in FIG. 9, after the PEP, the gate structure 316 has a first portion 316A disposed on the substrate 300 and covering a portion of the first insulation structure 318, and a second portion 316B positioned in the trench 322 thus penetrating into the base region 304. The gate dielectric layer 314 is disposed between the gate structure 316 and the base region 304 and the drift region 306.

Figure 10:
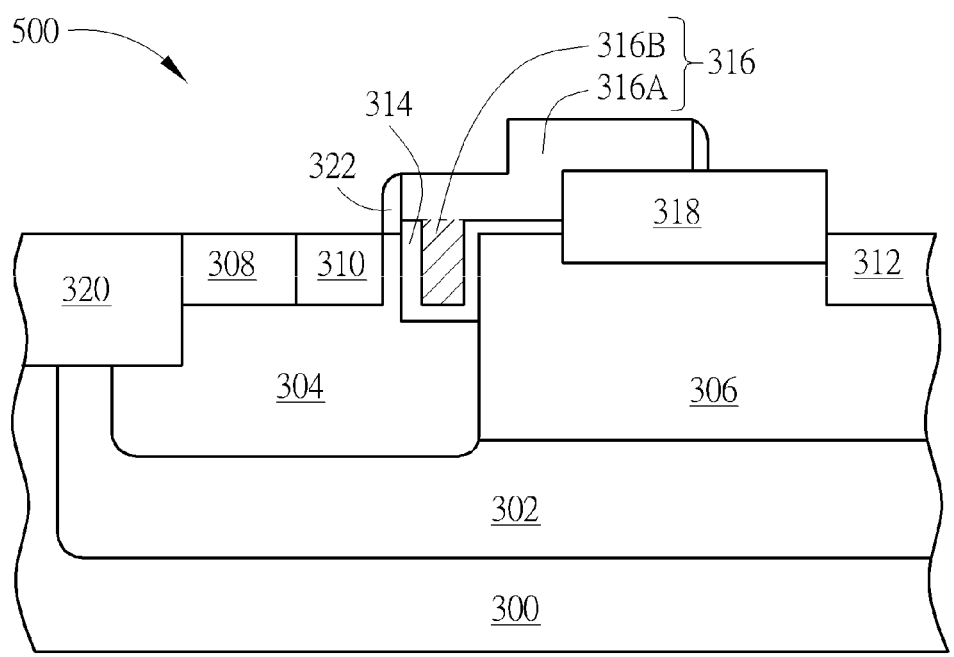

As shown in FIG. 10, a plurality of implant processes are performed to form the source region 310, the drain region 312, and the doping region 308 respectively. Preferably, the source region 310 and the drain region 312, both having the first conductivity type are formed simultaneously. The doping region 308 with the second conductivity type is formed by another implant process. In one embodiment, before forming the source region 310 and the drain region 312, a spacer 322 can be formed at the sidewall of the gate structure 316 such that when forming the source region 310 and the drain region 312, the spacer 322 can be used as a mask.

In summary, the present invention provides a HVMOS transistor device and a method of forming the same. Since the gate structure has a second portion penetrating into the substrate in the base region, the breakdown voltage of the HVMOS transistor device can be increased. In addition, the controllability of the gate structure can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a high voltage metal-oxide-semiconductor (HVMOS) transistor device, comprising:
   providing a substrate;
   forming a first insulation structure in the substrate;
   forming a trench in the substrate;
   forming a base region having a second conductivity type, wherein the base region encompasses the trench;
   forming a gate dielectric layer and a gate structure in the trench, wherein the gate structure is disposed on a portion of the first insulation structure; and
   forming a drain region and a source region in the substrate at two respective sides of the gate structure, the drain region and the source region comprising a first conductivity type, wherein the gate structure comprises a second portion penetrating into the base region and the second portion has a first depth and a second depth, the first depth is not equal to the second depth.

2. The method of forming a HVMOS transistor device according to claim 1, wherein a channel is defined between the source region and the drain region along a first direction and the trench has a battlement structure along a second direction perpendicular to the first direction.

3. The method of forming a HVMOS transistor device according to claim 2, wherein the trench has a plurality of sub-trenches, and the sub-trenches and the base region are arranged alternatively along the second direction.

4. The method of forming a HVMOS transistor device according to claim 2, wherein the trench has a plurality of sub-trenches, and each of the sub-trenches has the same depth.

5. The method of forming a HVMOS transistor device according to claim 1, wherein the substrate includes a deep well having the first conductivity type, and the base region is encompassed by the deep well.

6. The method of forming a HVMOS transistor device according to claim 1, before forming the source region and the drain region, further comprising forming a spacer at a sidewall of the gate structure.

7. The method of forming a HVMOS transistor device according to claim 1, before forming the gate structure, further comprises forming a drift region having the first conductivity type, and the drain region is encompassed by the drift region.

8. The method of forming a HVMOS transistor device according to claim 1, after forming the gate structure, further comprises forming a doping region in the base region, wherein the doping region has the second conductivity type.

* * * * *